(12) United States Patent
Shinotou

(10) Patent No.: US 6,781,838 B2
(45) Date of Patent: Aug. 24, 2004

(54) ATTACHING DEVICE FOR MOUNTING AND FIXING A DEVICE FOR GENERATING HEAT AND A HEAT SINK PROVIDED ON THE DEVICE FOR GENERATING HEAT ON A BOARD, A MOUNT BOARD HAVING THE BOARD, THE DEVICE FOR GENERATING HEAT, AND THE HEAT SINK, AND AN ATTACHING METHOD OF THE DEVICE FOR GENERATING HEAT AND THE HEAT SINK PROVIDING ON THE DEVICE FOR GENERATING HEAT ON THE BOARD

(75) Inventor: Kouichi Shinotou, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/356,744

(22) Filed: Feb. 3, 2003

(65) Prior Publication Data

US 2003/0154598 A1 Aug. 21, 2003

Related U.S. Application Data

(63) Continuation of application No. PCT/JP00/05224, filed on Aug. 3, 2000.

(51) Int. Cl.[7] .............................................. H05K 7/20
(52) U.S. Cl. ...................... 361/704; 361/695; 361/697; 361/719; 257/718; 257/722; 257/727; 174/16.3; 165/80.3
(58) Field of Search ................................ 361/695, 704, 361/718–719; 257/706, 707, 718–719, 727; 174/16.1–16.3; 165/80.3, 185; 439/342, 487

(56) References Cited

U.S. PATENT DOCUMENTS

| 5,256,080 | A | * | 10/1993 | Bright | 439/342 |
| 5,668,348 | A | * | 9/1997 | Lin | 174/16.3 |
| 5,810,608 | A | * | 9/1998 | MacGregor et al. | 439/69 |
| 6,118,659 | A | * | 9/2000 | Adams et al. | 361/704 |
| 6,219,241 | B1 | * | 4/2001 | Jones | 361/704 |
| 6,381,836 | B1 | * | 5/2002 | Lauruhn et al. | 29/831 |
| 6,636,424 | B2 | * | 10/2003 | Lee et al. | 361/705 |
| 6,648,664 | B1 | * | 11/2003 | McHugh et al. | 439/331 |

FOREIGN PATENT DOCUMENTS

| JP | 54-49865 | 4/1979 |
| JP | 8-148614 | 6/1996 |
| JP | 8-330485 | 12/1996 |
| JP | 9-245918 | 9/1997 |

* cited by examiner

*Primary Examiner*—Boris Chervinsky
(74) *Attorney, Agent, or Firm*—Westerman, Hattori, Daniels & Adrian, LLP

(57) ABSTRACT

An attaching device is provided for mounting and fixing a device for generating heat, such as a semiconductor device, and a heat sink provided on the device for generating heat on a board. The attaching device includes a base part fixed to the board, a rotation member provided to the base part rotatably, the rotation member rotated and received at the base part so that the device for generating heat, is fixed to the board, and a press mechanism that presses the heat sink to the device for generating heat when the rotation member is rotated.

4 Claims, 8 Drawing Sheets

ATTACHING DEVICE FOR MOUNTING AND FIXING A DEVICE FOR GENERATING HEAT AND A HEAT SINK PROVIDED ON THE DEVICE FOR GENERATING HEAT ON A BOARD, A MOUNT BOARD HAVING THE BOARD, THE DEVICE FOR GENERATING HEAT, AND THE HEAT SINK, AND AN ATTACHING METHOD OF THE DEVICE FOR GENERATING HEAT AND THE HEAT SINK PROVIDING ON THE DEVICE FOR GENERATING HEAT ON THE BOARD

This application is a continuation of international application PCT/JP00/05224 filed on Aug. 3, 2000.

TECHNICAL FIELD

The present invention generally relates to an attaching device for mounting and fixing a device for generating heat, such as a semiconductor device and a heat sink provided on the device for generating heat on a board, a mount board having the board, the device for generating heat and the heat sink, and an attaching method of the device for generating heat and the heat sink provided on the device for generating heat on the board.

BACKGROUND ART

For an electronic device such as a personal computer, a ZIF (Zero Insertion Force) socket (hereinafter "socket"), for example, is used for exchangably mounting a semiconductor device such as a CPU (Central Processing Unit) on a board.

FIG. 1 is a exploded perspective view showing a structure of a mounted board on which a related art socket is mounted.

Referring to FIG. 1, the mount board 1 includes a socket 2 that is mounted and fixed on a board 3 with other electronic parts. A semiconductor device 4 is mounted on the socket 2. A heat sink 5 is provided on the semiconductor device 4. A fan 6 is provided for the heat sink 5. One end of a wire of a connector 7a for connecting an electric power source for driving the fan 6 is connected to a motor (not shown in FIG. 1) for driving the fan 6. An electric power source connector 7b that is connected to the connector 7a is provided close to the socket 2 and mounted on the board 3.

The socket 2 includes two members 2-1 and 2-2 having a thin plate rectangular parallelepiped configuration. Corresponding to the rotation of the lever 2i described later, the member 2-1 slides against the member 2-2. Opening parts 2-1b and 2-2b are respectively formed in a center of main surfaces 2-1a and 2-2a of the two members 2-1 and 2-2. A terminal 3a is provided on the board 3 as facing the opening parts 2-1b and 2-2b of the members 2-1 and 2-2. A large number of first terminal receiving hole forming parts 2-1c are formed as surrounding the opening part 2-1b of the member 2-1 and facing each other.

Second terminal receiving hole forming parts 2-2c having larger diameters than the first terminal receiving hole forming parts 2-1c are formed at a position corresponding to the first terminal receiving hole forming parts 2-1c surrounding the opening part 2-1b of the member 2-1 and facing each other. Each second terminal receiving hole forming part 2-2c is connected to a contact hole forming part 3a that is formed at the board 3 so as to make a through hole. A wide end part of a contact 500 is provided at the second terminal receiving hole forming part 2-2c and the other end part of the contact 500 goes through the contact hole forming part 3a.

A claw part 2e is provided at one side part in the X2 direction of the member 2-2 of the socket 2. Furthermore, a claw part 2f is provided at one side part in the X1 direction of the socket 2. In addition, claw parts 2g and 2h are provided at one side part in the Y1 direction of the member 2-1 so as to be off set to the Z1-Z2 direction and the X1-X2 direction. Furthermore, the lever 2i is rotatably provided at an end part of one side part in then X1 direction of the member 2-1. A head end part of the lever 2i has a step-like configuration.

The semiconductor device 4 is a PGA (Pin Grid Array) type semiconductor device. A large number of pins 4a for electric power and signals are hung down from a lower part of the semiconductor device 4 in the Z2 direction.

The fan 6 is provided at the upper part of the heat sink 5. A large number of fins 5a having long lengths in the Y1-Y2 direction stand at the heat sink 5. A groove forming part 5b is formed so as to cross through the large number of fins 5a in the X1-X2 direction. A metal fitting 5c for fixing is provided at the groove forming part 5b detachably or movably at least in the X1-X2 direction. The metal fitting 5c is formed like a plate spring so as to bend in the Z2 direction in a convex configuration. Receiving parts 5c-1 and 5c-2 having rectangular configurations and opening parts are formed at respective end parts of the metal fitting 5c.

The mount board 1 having the above mentioned structure is assembled by the following steps.

First, the pin 4a of the semiconductor device 4 is inserted into the terminal receiving holes 2-1c and 2-2c of the socket 2 fixed at the board 3 so that the semiconductor device 4 is mounted on the socket 2. (a mounting process of the semiconductor device)

Next, the lever 2i is pushed down (rotated) so that the lever 2i is received in a space between the claw part 2g and the claw part 2h. At this time, corresponding to the rotation of the lever 2i, the member 2-1 slides against the member 2-2 due to a pushing part (not shown in FIG. 1) formed at the end part of the lever 2i so as to slightly move in the X2 direction. A head end part of the pin 4a pushed by the movement of the member 2-1 is received at the contact 500. (a pin receiving process)

Next, the heat sink 5 where the metal fitting 5c is provided is mounted on the semiconductor device 4. (a heat sink mounting process)

After that, the receiving parts 5c-1 and 5c-2 are bent in the Z2 direction so that the receiving part 5c-1 is received at the claw part 2f of the socket 2 and the receiving part 5c-2 is received at the claw part 2e of the socket 2. As a result of this, the heat sink 5 is fixed at the socket 2 with the semiconductor device 4. (a heat sink fixing process) At that time, the heat sink 5 is pressed and stands close to the semiconductor device 4 by a spring force generated by the deformation of the metal fitting 5c.

Furthermore, the connector 7a is connected to the electric power source connector 7b. (a connector connecting process) FIG. 2 is a perspective view showing a state where the mounted board 1 shown in FIG. 1 is assembled.

However, according to the above mentioned related art, five processes, namely the mounting process of semiconductor device, the pin receiving process, the heat sink mounting process, the heat sink fixing process, and the connector connecting process are necessary for mounting the semiconductor device 4 on the above mentioned mount board 1. Hence, the assembling work for the mount board 1 is complicated so that the efficiency of the assembling work for the mount board 1 is low. In addition, there are the same problems as the assembling work for the mount board 1, in a case of analyzing and maintaining work for the exchange of the semiconductor device, for example, where the processes are implemented opposite to the assembling work for the mount board 1.

DISCLOSURE OF INVENTION

Accordingly, it is a general object of the present invention is to provide a novel and useful attaching device for mounting and fixing a device for generating heat, such as a semiconductor device, and a heat sink provided on the device for generating heat on a board, a mount board having the board, the device for generating heat and the heat sink, and an attaching method of the device for generating heat and the heat sink provided on the device for generating heat on the board, so as to make the assembling, analyzing, and maintaining work for the mount board easy and realize a high efficiency of the work.

Another and more specific object of the present invention is to provide an attaching device for mounting and fixing a device for generating heat and a heat sink provided on the device for generating heat on a board, including a base part fixed to the board, a rotation member provided to the base part rotatably, the rotation member rotated and received at the base part so that the device for generating heat is fixed to the board, and a press mechanism that presses the heat sink to the device for generating heat when the rotation member is rotated.

Another object of the present invention is to provided a mount board having a board, a device for generating heat fixed to the board, and a heat sink provided on the device for generating heat, wherein the device for generating heat and the heat sink are fixed to the board by an attaching device, the attaching device comprising: a base part fixed to the board; a rotation member provided to the base part rotatably, the rotation member rotated and received at the base part so that the device for generating heat is fixed to the board; and a press mechanism that presses the heat sink to the device for generating heat when the rotation member is rotated.

Another object of the present invention is to provide an attaching method of a device for generating heat and a heat sink provided on the device for generating heat on a board by an attaching device, wherein a rotation device rotatably provided at a base part of the attaching device is rotated so as to be received at the base part, so that the device for generating heat is fixed and the heat sink is pressed to the device for generating heat.

BEST MODE FOR CARRYING OUT THE INVENTION

Figure 1:
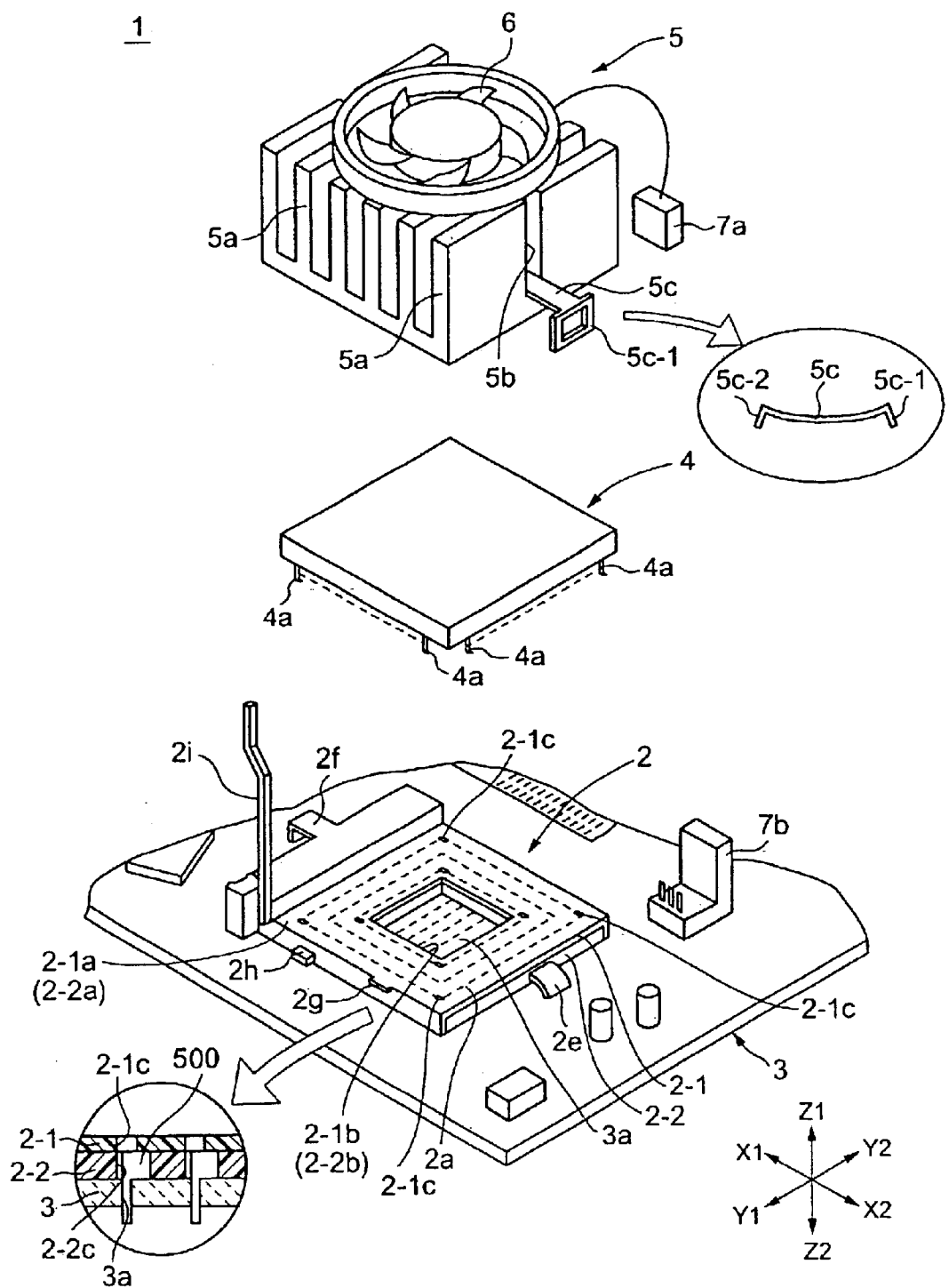
FIG. 1 is an exploded perspective view showing a structure of a mount board on which the related art socket is mounted.
Figure 2:
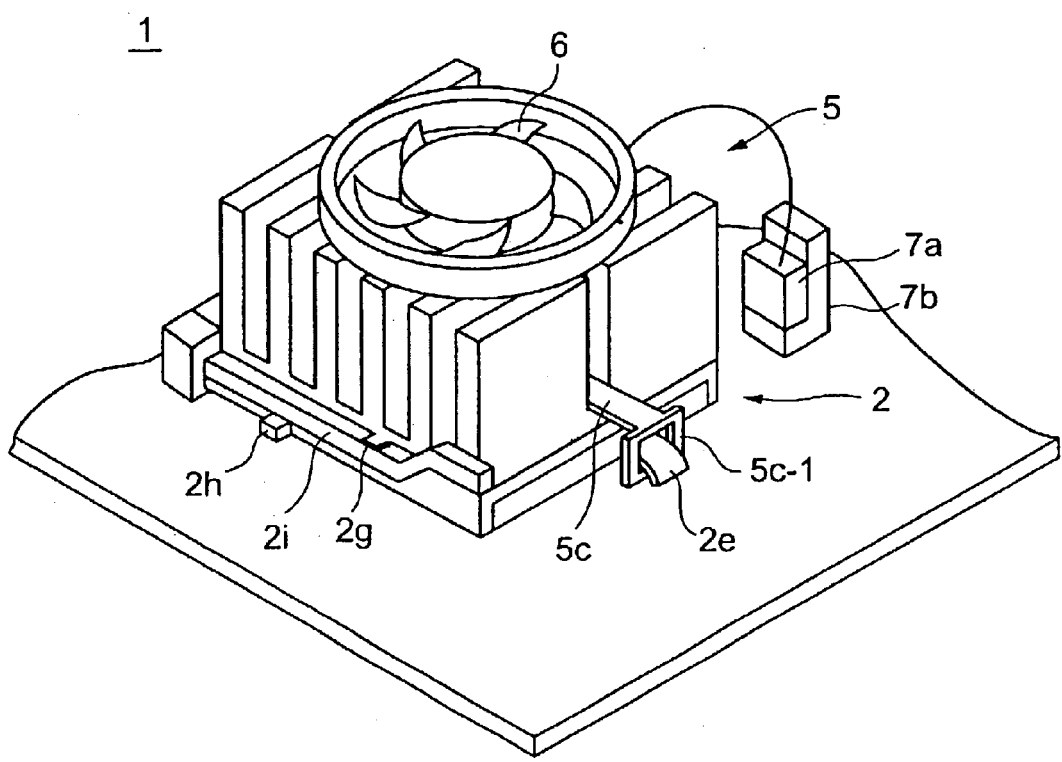
FIG. 2 is a perspective view showing a state where the mount board shown in FIG. 1 is assembled.

A description will now be given, with reference to the FIGS. 3 through 6C, of embodiments of the present invention. Since a basic function of a mount board and a basic device element for implementing the basic function in the following embodiment are same as the related art device, in FIGS. 3–6, parts that are the same as the parts shown in FIGS. 1 and 2 are given the same reference numerals, and explanation thereof will be omitted.

[First Embodiment]

Figure 3:
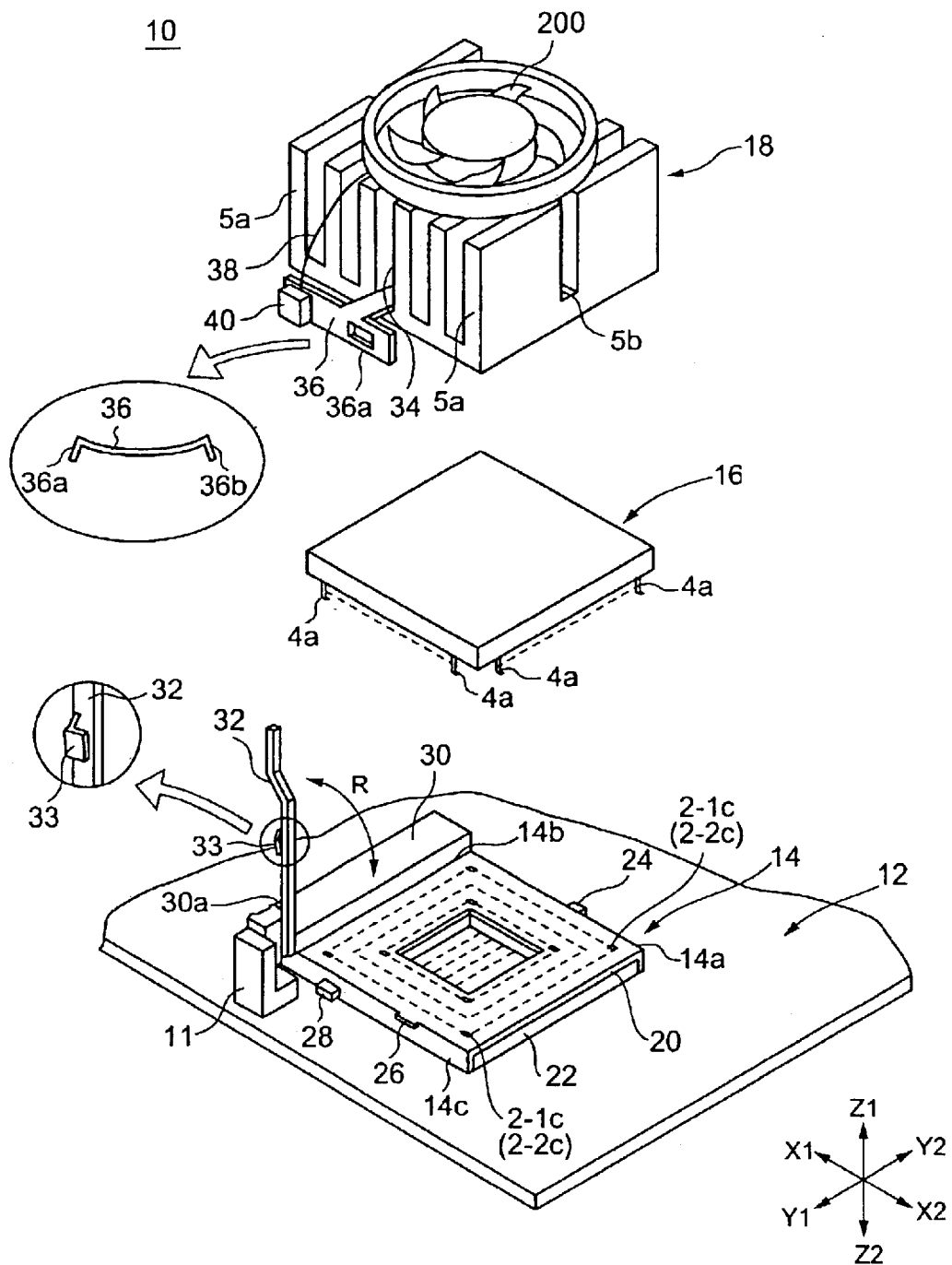
FIG. 3 is an exploded perspective view showing a structure of a mount board where a semiconductor device and others are attached on a board by a socket of the first embodiment.

FIG. 3 is an exploded perspective view showing a structure of a mount board where a semiconductor device and others are attached on a board by a socket of the first embodiment.

A mount board 10 includes a socket (attaching device) 14 mounted and fixed on a board 12, a semiconductor device 16 mounted on the socket 14, and a heat sink 18 provided on the semiconductor device 16. A fan 200 is provided for the heat sink 18. The heat sink 18 may have a structure where the fan 200 is not provided. An electric power source connector 11 is provided on the board 12 close to the socket 14 and other electronic parts not shown in FIG. 3 are mounted on the board 12. See FIG. 1.

The socket 14 includes two members (base parts), namely a first member 20 and a second member 22 that have substantially frame body configurations. Corresponding to the rotation of a lever (rotation member) 32 described later, the first member 20 slides on the second member 22.

A claw part 24 is provided at one side part 14a in the Y2 direction of the first member 20 of the socket 14. In addition, claw parts 26 and 28 are provided at one side part 14c in the Y1 direction facing one side part 14a of the first member 20, so as to be off set to the Z1-Z2 direction and the X1-X2 direction.

Furthermore, the lever (rotation member) 32 is provided at an end part of a stand part (not shown in FIG. 3) that stands at a side part 14b in the X1 direction of the second member 22 covered with a standing-up part 30 having an L shape opposite to the first member 20. For example, one end part of the lever 32 is inserted into a slit 30a formed at the standing-up part 30. A head end part of the lever 32 is bent in the X1 direction. The lever 32 is received in a space between the stand part and the standing-up part 30 so that the lever 32 can be rotated in the R direction shown by an arrow in FIG. 3. Corresponding to the rotation of the lever 32, the first member 20 is pushed in the X2 direction by proper means such as a crank mechanism. A head end part of another end part of the lever 32 has a step-like configuration. The claw part (receiving part) 33 is formed at a substantially center part in the Z1-Z2 direction of the lever 32.

Terminal receiving hole forming parts 2-1c and 2-2c go through the first member 20 and the second member 22 of the socket 14, respectively.

The semiconductor device 16 is a PGA (Pin Grid Array) type semiconductor device. A large number of pins 4a for electric power and signals are hung down from a lower part of the semiconductor device 16 in the Z2 direction.

The fan 200 is provided at the upper part of the heat sink 18. A large number of fins 5a stand at the heat sink 18 in the Y1-Y2 direction. A groove forming part 5b is formed so as to cross through in the large number of fins 5a in the X1-X2 direction. A metal fitting (receiving member) 36 for fixing is detachably provided at a groove forming part 34 between two of the fins 5a situated at the center part in the X1-X2 direction.

The metal fitting 36 is formed like a plate spring so as to bend in the Z2 direction in a convex configuration. A first receiving part 36a and a second receiving part 36b having rectangular configurations and opening parts are formed at respective end parts of the metal fitting 36. The metal fitting 36 may be attached at the heat sink 18 so that the convex part of the metal fitting 36 may be deformed.

A wire 38 is pulled out from a motor (not shown in FIG. 3) for driving the fan 200 is pulled out. A connector 40 for connecting an electric power source, provided at an end part of the wire 38, is fixed to the end part of the first receiving part 36a. In this case, the connector 40 may be directly fixed to the heat sink 18.

Figure 4A:
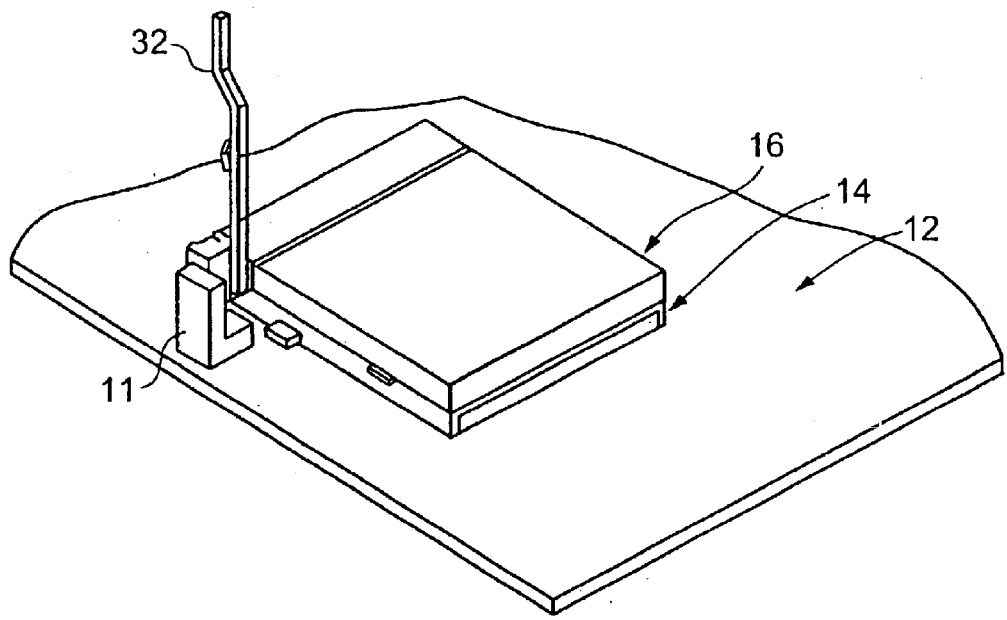
FIG. 4A is a view for explaining assembling processes of the mount board shown in FIG. 3 and showing a state where a semiconductor device is mounted on the socket.

Next, a mounting method of the mount board 10 having the above mentioned structure of the first embodiment, namely an attaching method by the socket 14, will be described with reference to FIGS. 4A through 4C.

First, the board 12 where the socket 14 is mounted is prepared. And then, as shown in FIG. 4A, the pin 4a of the semiconductor device 16 is inserted into the terminal receiving holes 2-1c and 2-2c of the socket 14 (See FIG. 3) so that the semiconductor device 16 is mounted on the socket 14. (a mounting process of semiconductor device). In this step, the pin 4A is not received by the contact 500 (See FIG. 1).

Figure 4B:
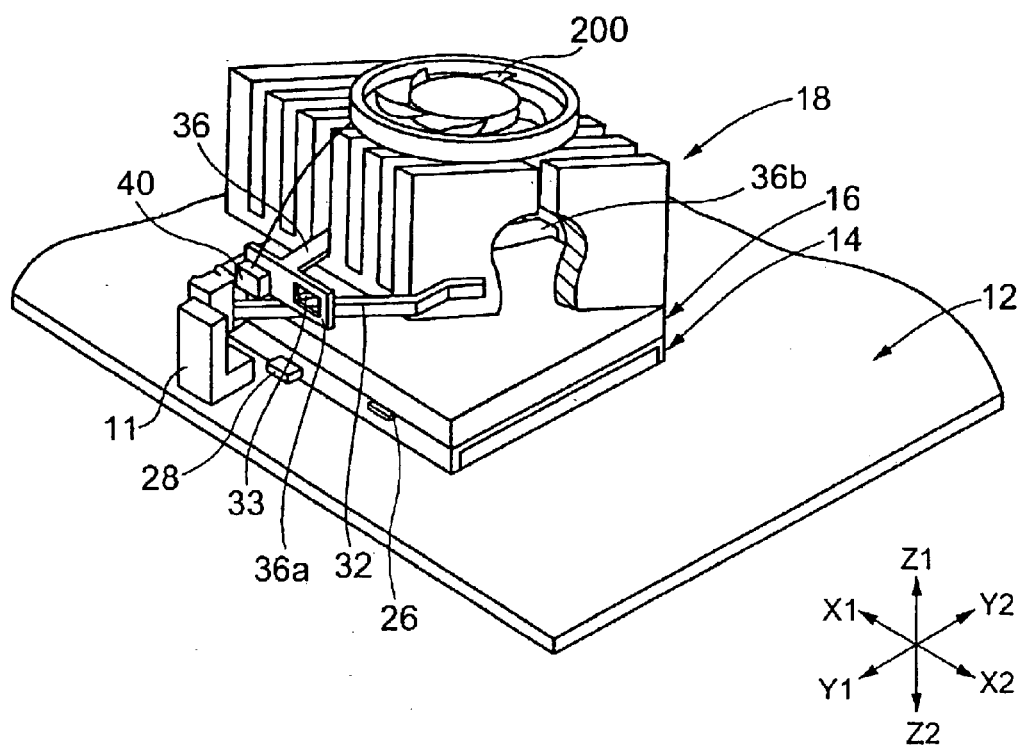
FIG. 4B is a view for explaining assembling processes of the mount board shown in FIG. 3 and showing a state where a heat sink is received at a socket and a lever during the rotation of the lever.

Next, as shown in FIG. 4B, the heat sink 18 where the metal fitting 36 is provided is prepared. In a state where the second receiving part 36b of the metal fitting 36 is received at the claw part 24 (See FIG. 3) of the socket 14 and the lever 32 is rotated in the X2 direction a little, the first receiving part 36a of the metal fitting 36 is received at the claw part 33 of the lever 32. (a receiving member receiving process).

Figure 4C:
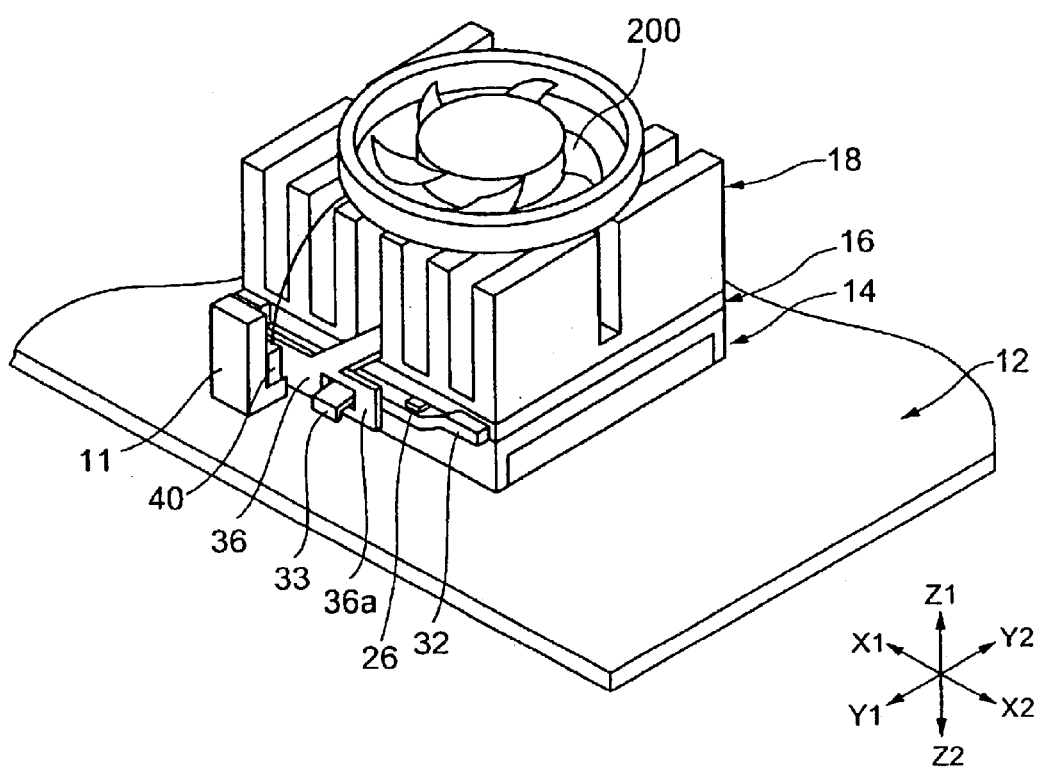
FIG. 4C is a view for explaining assembling processes of the mount board shown in FIG. 3 and showing a state where the lever is received at the socket.

Next, as shown in FIG. 4C, by adding a force resisting a spring force generated by bending of the metal fitting 36, the lever 32 is pushed down completely to a horizontal position in the X2 direction. (a heat sink fixing process) At this time, the following actions occur.

Since the lever 32 has a little play in the Y1-Y2 direction, the lever 32 is received between the claw parts 26 and 28 (See FIGS. 4B and 4C). In a state where the lever 32 is received, when a restoring force, by which the metal fitting 36 is pushed upward (in the Z1 direction) is applied to the metal fitting 36, the lever 32 is pulled in the Y2 direction so that the lever 32 is fixed between the claw parts 26 and 28. A second receiving portion having the second receiving part 36b and the claw part 24 (See FIG. 3) and a first receiving portion having the first receiving part 36a and the claw part 33 (See FIG. 3) are pulled in the Y1-Y2 directions toward each other, so that the metal fitting 36 is surely fixed to the socket 14 and the lever 32.

The heat sink 18 is pressed by the metal fitting 36 and stands close to the semiconductor device 16, based on the spring force of the metal fitting 36 fixed by the socket 14 and the lever 32. As a result of this, the heat sink 18, the semiconductor device 16 and the socket 14 are fixed in a body. The head end part of the pin 4a shown in FIG. 1 is received at the contact 500 shown in FIG. 1, so that the connector 40 is connected to the electric power source connector 11 (See FIG. 3).

Because of this, the mount board 10 can be obtained. Therefore, the claw part 33 functions as an element for a press mechanism that presses the heat sink 18 to the semiconductor device 16 when the lever 32 is rotated, so that the claw part 33 works with the metal fitting 36.

According to the mount board 10 and the mount method of the first embodiment as described above, one end part of the metal fitting (receiving member) 36, the metal fitting 36 being like a spring provided at the heat sink 18, is received at the socket 14, and the lever 32 is rotated so as to be received at the socket 14 after the other end of the metal fitting 36 is received at the lever 32, so that the semiconductor device 16, the heat sink 18 and the board 12 are unified. Hence, the related art pin receiving process, heat sink mounting process, and heat sink fixing process are simplified.

Furthermore, the rotation member 32 is rotated so that the above mentioned devices are finally fixed by just a one touch operation so that the operation is easy. Hence, a high efficiency of the assembling operation can be realized. In addition, with regard to the analyzing operation for maintenance that is done by a process opposite to the assembling operation, the fixed state of the device is canceled by a one touch operation based on the rotation of the rotation member 32. Hence, the same efficient effect as the assembling process can be obtained.

Since the heat sink 18 is pressed to the semiconductor device 14 in a state where the metal fitting 36 (receiving member) like a spring is bent, the heat sink 18 stands close to the semiconductor device 14 surely so that the cooling efficiency can be improved.

In addition, a connecting mechanism is provided in this embodiment. Based on the connecting mechanism, when the lever 32 is rotated, the connecting mechanism provided together with the heat sink 18 and the connector 40 for connecting electric power for driving the fan 200 for cooling the heat sink 18 is connected to the electric power source connector 11 provided at the board 12. In a case where the heat sink 18 having the fan 200 so that a high cooling efficiency is obtained is used, the connector 40 can be connected to the electric power source connecter 11 by rotating the lever 32. Hence, the related art connector connecting process can be substantially omitted, so that the mount board 10 can be assembled easily.

In addition, with regard to the analyzing operation for maintenance, the same effect as the assembling process can be obtained. Here, the connector 40 may be fixed to the heat sink 18 itself or fixed to the metal fitting 36 for fixing provided at the heat sink 18.

Furthermore, since the device of the first embodiment can be obtained based on the alternation of the related art device, members of the device can be obtained easily and the expense for the alternation is low.

[Second Embodiment]

Figure 5:
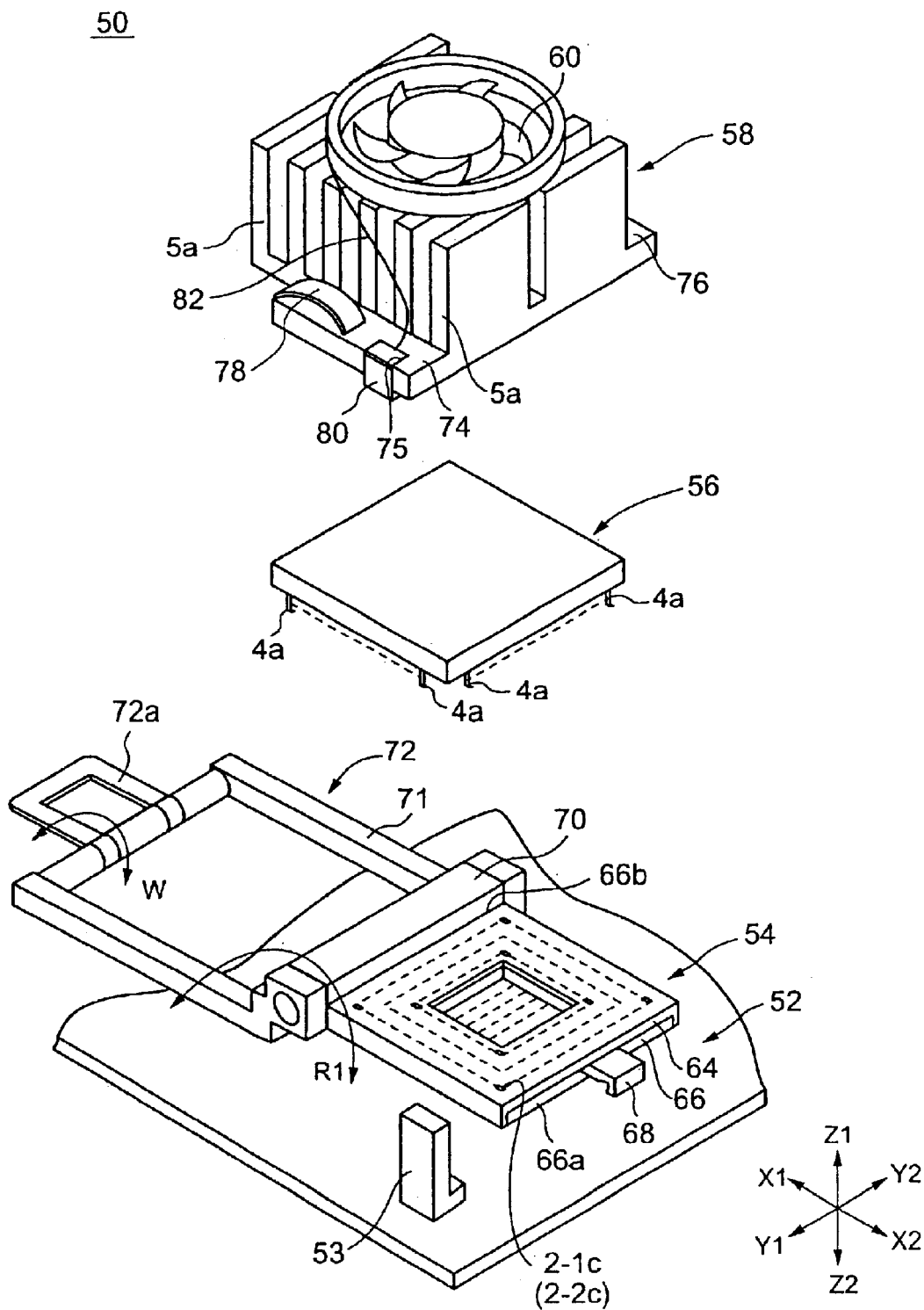
FIG. 5 is an exploded perspective view showing a structure of a mount board where a semiconductor device and others are attached on a board by a socket of the second embodiment.

FIG. 5 is an exploded perspective view showing a structure of a mount board where a semiconductor device and others are attached on a board by a socket of the second embodiment.

Referring to FIG. 5, a mount board 50 includes a socket (attaching device) 54 mounted and fixed on a board 52, a semiconductor device 56 mounted on the socket 54, a heat sink 58 provided on the semiconductor device 56. A fan 60 is provided for the heat sink 58. The heat sink 58 may have a structure where the fan 60 is not provided. An electric power source connector 53 is provided on the board 52 close to the socket 54 and other electronic-parts not shown in FIG. 5 are mounted on the board 12. See FIG. 1.

The socket 54 has a thin plate rectangular parallelepiped configuration and includes two members (base parts), namely a first member 64 and a second member 66, having substantially frame body configurations. Corresponding to the rotation of a lever (rotation member) 72 described later, the first member 64 slides on the second member 66.

A claw part 68 is provided at one side part 66a in the X2 direction of the second member 66 of the socket 54.

Furthermore, the lever (rotation member) 72 provided at an end part of a stand part (not shown in FIG. 5) stands at the one side part 66b in the X1 direction of the second member 66 covered with a standing-up part 70 having an L shape opposite to the first member 64. The lever 72 has a contacting part 71 having a frame body configuration. For example, projections not shown in FIG. 5 are formed at the lever 72 at lower end parts of both side parts as facing inside. The projections are received in hole forming parts (not shown in FIG. 5) formed at both end parts of the stand part, so that the lever 72 can be rotated in an R1 direction shown by an arrow in FIG. 5. Corresponding to the rotation of the lever 72, the first member 64 is pressed in the X2 direction by a proper means such as a crank mechanism. The receiving part 72a of the lever 72, having an opening part at one side part thereof, can be rotated in W directions shown by an arrow in FIG. 5.

Terminal receiving hole forming parts 2-1c and 2-2c go through the first member 64 and the second member 66 of the socket 54, respectively.

The semiconductor device 56 is a PGA (Pin Grid Array) type semiconductor device. A large number of pins 4a for electric power and signals are hung down from a lower part of the semiconductor device 56 in the Z2 direction. A large number of fins 5a having long lengths stand at the heat sink 58 in the Y1-Y2 direction.

Projecting parts 74 and 76 are formed at respective sides in the Y1-Y2 directions of the heat sink 58. Plate springs (contacting members having a spring configuration) 78 and 79 (the plate spring 79 is not shown in FIG. 5), that can have upward (in the Z1 direction) convex configurations are fixed to the projecting parts 74 and 76. A connector 80 for connecting the electric power source for the fan 60 is fixed to a groove forming part 75 formed at an end part of the projecting part 74. The connector 80 and a motor (not shown in FIG. 5) for driving the fan 60 are connected by a wire 82. In this case, the connector 80 may be directly fixed to the heat sink 58.

Figure 6A:
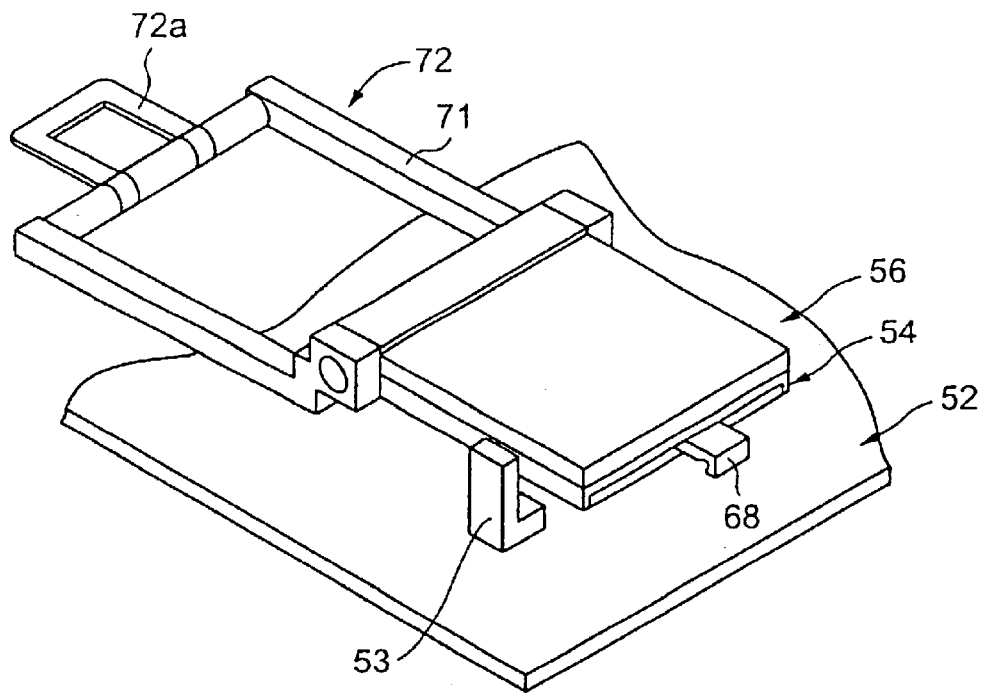
FIG. 6A is a view for explaining assembling processes of the mount board shown in FIG. 5 and showing a state where a semiconductor device is mounted on the socket.

Next, a mounting method of the mount board 50 having the above mentioned structure of the second embodiment, namely an attaching method by the socket 54, will be described with-reference to FIGS. 6A through 6C.

First, the board 52 where the socket 54 is mounted is prepared. And then, as shown in FIG. 6A, the pin 4a of the semiconductor device 56 is inserted into the terminal receiving holes 2-1c and 2-2c of the socket 54 (See FIG. 5) so that the semiconductor device 56 is mounted on the socket 54. (a mounting process of semiconductor device). In this step, the pin 4a is not received by the contact 500 (See FIG. 1).

Figure 6B:
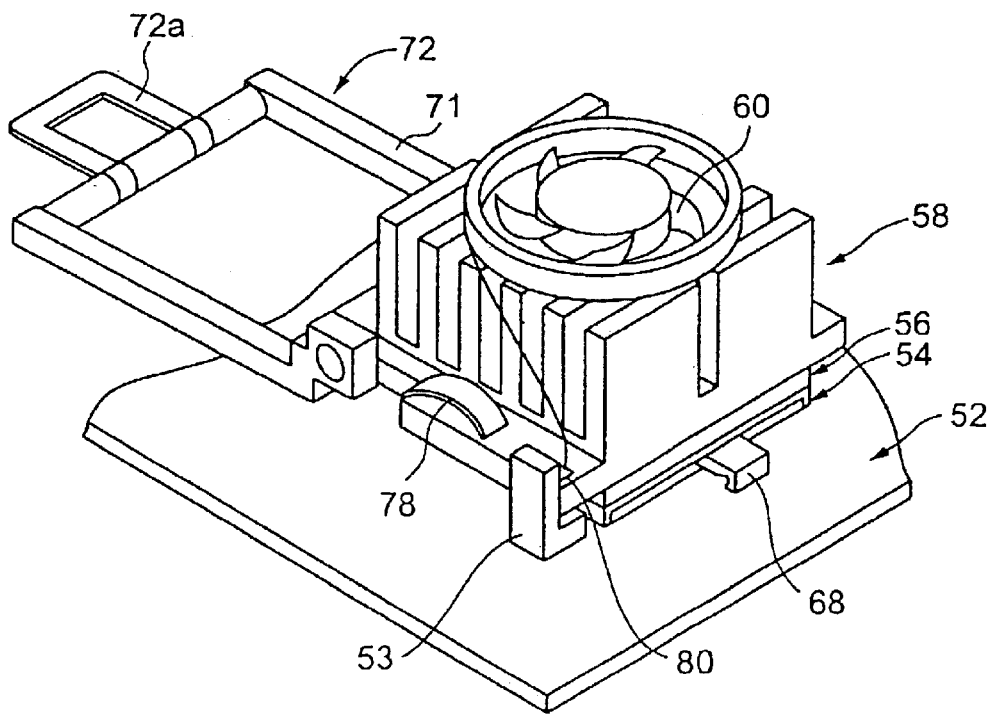
FIG. 6B is a view for explaining assembling processes of the mount board shown in FIG. 5 and showing a state where a heat sink is mounted on the semiconductor device.

Next, as shown in FIG. 6B, the heat sink 58 is mounted on the semiconductor device 56 as connecting the connector 80 to the connector 53 for the electric power source. (a heat sink mount process)

Figure 6C:
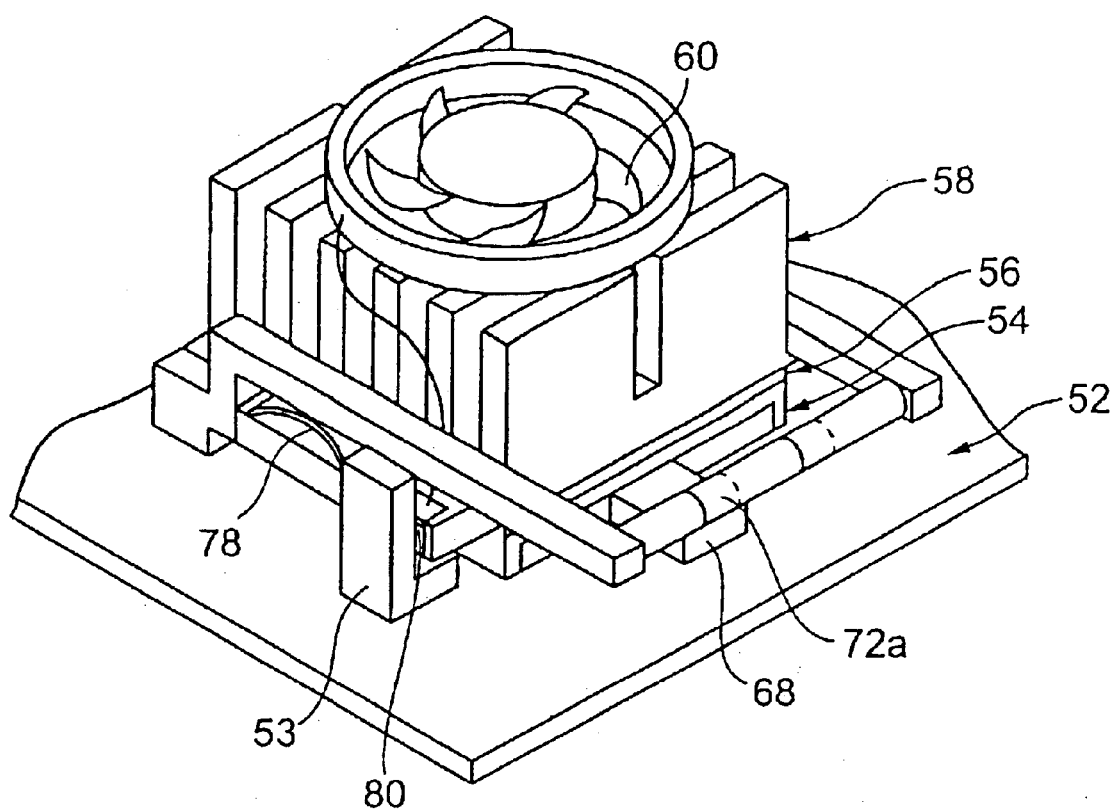
FIG. 6C is a view for explaining assembling processes of the mount board shown in FIG. 5 and showing a state where a lever is received at the socket.

And then, as shown in FIG. 6C, by adding a force resisting a spring force generated by bending of the plate springs 78 and 79, the lever 72 is rotated 180 degrees to a horizontal position in the X2 direction so as to be pushed down completely to a position where the both sides of the lever 72 come in contact with the respective projecting parts 74 and 76. Furthermore, the receiving part 72a of the lever 72 is rotated inward so that the receiving part 72a is received by the claw part 68 of the socket 54. (a heat sink fixing process) At this time, the following actions occur.

In a state where the lever 72 is received, when a restoring force, by which the plate springs 78 and 79 are pushed upward (in the Z1 direction) is applied to the plate springs 78 and 79, a upward force (force in the Z1 direction in FIG. 6C) is given to the receiving part 72a of the lever 72. Because of this, the receiving part 72a of the lever 72 is tightly fixed to the claw part 68.

Based on a reaction force of the plate springs 78 and 79 restricted by the contact part 71 of the lever 72, the heat sink 58 and the semiconductor device 56 are surely fixed to the socket 54.

A head end part of the pin 4a is received by the contact 5. The connector 80 is connected to the connector 58 for the electric power source.

Because of this, the mount board 50 can be obtained. Therefore, the contact part 71 of the lever 72 functions as an element for a press mechanism that presses the heat sink 58 to the semiconductor device 56 when the lever 72 is rotated, so that the contact part 71 works with the projecting parts 74 and 76.

According to the mount board 50 and the mount method of the second embodiment as described above, when the mount board 50 is assembled (at the time of mount process), in a state where the heat sink 58 is mounted on the semiconductor device 54, the lever 72 is rotated so as to be received at the socket 54, so that the semiconductor device 56, the heat sink 58 and the board 52 are unified. Hence, the related art pin receiving process, heat sink mounting process, and heat sink receiving and fixing process are simplified.

Furthermore, the rotation member 72 is rotated so that the above mentioned devices are fixed by just a one touch operation so that the operation is easy. Hence, a high efficiency of the assembling operation can be realized. In addition, with regard to the analyzing operation for maintenance that is done by a process opposite to the assembling operation, the fixed state of the device is canceled by the one touch operation based on the rotation of the rotation member 72. Hence, the same effect as the assembling process can be obtained.

Since the heat sink 58 is pressed to the semiconductor device 54 in a state where the plate springs (receiving members having a spring configuration) 78 and 79 are bent, the heat sink 58 stands close to the semiconductor device 54 surely so that the cooling efficiency can be improved. In addition, during the rotation of the rotation member 72, it is not necessary to do an operation where the heat sink 58 is received by the lever 72 so that the attaching method can be simplified.

In addition, a connecting mechanism is provided in this embodiment. Based on the connecting mechanism, when the lever 72 is rotated, the connecting mechanism provided together with the heat sink 58 and the connector 80 for connecting an electric power source for driving the fan 60 for cooling the heat sink 58 is connected to the electric power source connector 53 provided at the board 52. In a case where the heat sink 58 having the fan 60 so that a high cooling efficiency is obtained is used, the connector 80 can be connected to the electric power source connecter 53 by rotating the lever 72. Hence, the related art connector connecting process can be substantially omitted, so that the mount board 52 can be assembled easily. In addition, with regard to the analyzing operation for maintenance, the same effect as the assembling process can be obtained. Here, the connector 80 may be fixed to the heat sink 58 itself.

Furthermore, since the receiving operation is implemented by only a one time operation by the lever 72, the assembling process for the mount board in the second embodiment is easier than the first embodiment.

The present invention can be applied to a device for generating heat other than a semiconductor device.

The present invention is not limited to the above mentioned embodiments, but various variations and modificatins may be made without departing from the scope of the present invention.

What is claimed is:

1. An attaching device for mounting and fixing a semiconductor device and a heat sink provided on the semiconductor device on a board, comprising:
    a base part fixed to the board;
    a rotation member provided to the base part rotatably, the rotation member rotated and received at the base part so that the semiconductor device is fixed to the board; and
    a press mechanism that presses the heat sink to the semiconductor device when the rotation member is rotated;
    wherein:
    the press mechanism has a receiving part provided at the rotation member,
    the receiving part is received by a receiving member having a spring configuration and provided at the heat sink detachably, and
    the receiving member is bent when the rotation member is rotated.

2. The attaching device, as claimed in claim 1, further comprising a connecting mechanism,
    wherein when the rotation member is rotated, a connecting mechanism provided together with the heat sink and a connector for connecting electric power for driving a fan for cooling the heat sink is connected to an electric power source connector provided at the board by the connecting mechanism.

3. An attaching method of a semiconductor device and a heat sink provided on the semiconductor device on a board by an attaching device, wherein a rotation device rotatably provided at a base part of the attaching device is rotated so as to be received at the base part, so that the semiconductor device is fixed and the heat sink is pressed to the semiconductor device;
    wherein
    a receiving part provided at the rotation member is received by a receiving member having a spring configuration and provided at the heat sink detachably, and
    the receiving member is bent when the rotation member is rotated.

4. The attaching method as claimed in claim 3, wherein when the rotation member of the attaching device is rotated, a connecting mechanism provided together with the heat sink and a connector for connecting electric power for driving a fan for cooling the heat sink is connected to an electric power source connector provided at the board by the connecting mechanism.

* * * * *